Figure 1:
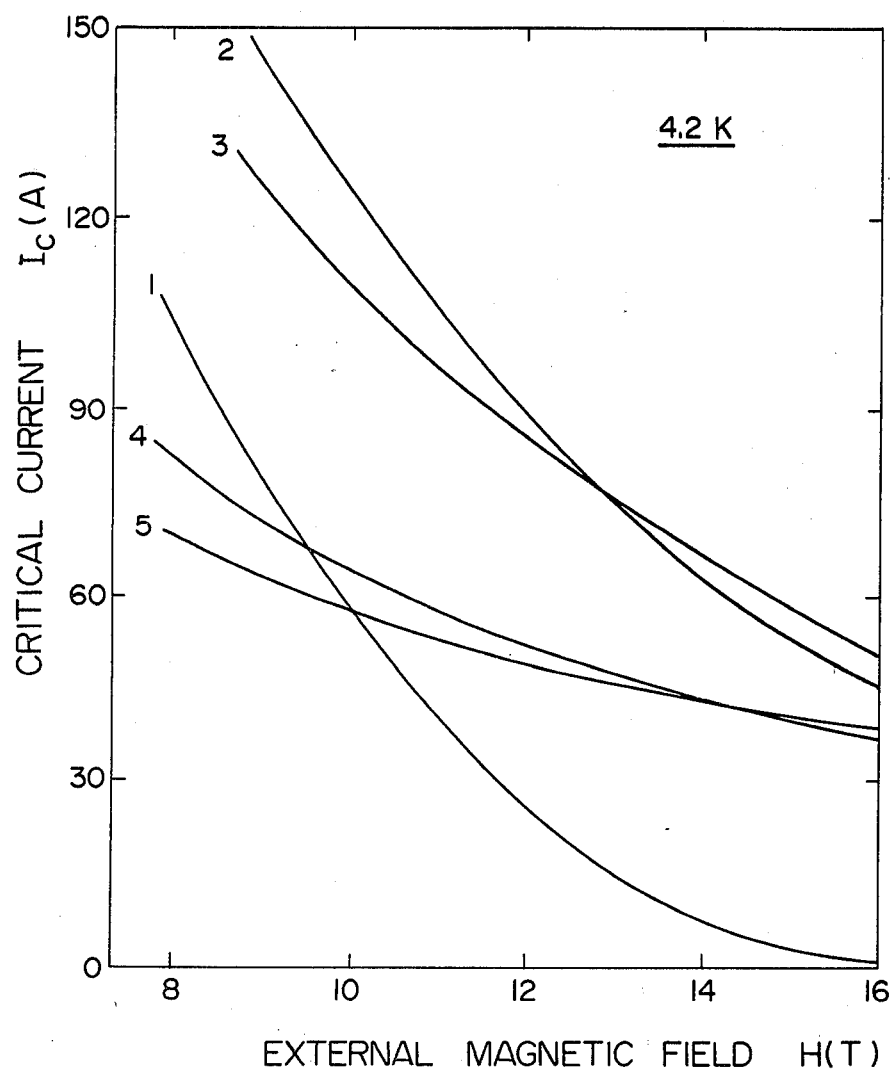

United States Patent [19]

Tachikawa et al.

[11] 4,385,942
[45] May 31, 1983

[54] METHOD FOR PRODUCING NB₃SN SUPERCONDUCTORS

[75] Inventors: Kyoji Tachikawa, Tokyo; Toshihisa Asano; Takao Takeuchi, both of Sakura, all of Japan

[73] Assignee: National Research Institute for Metals, Tokyo, Japan

[21] Appl. No.: 302,956

[22] Filed: Sep. 16, 1981

[30] Foreign Application Priority Data

Sep. 18, 1980 [JP] Japan ................................ 55-128551

[51] Int. Cl.³ ..................... H01L 39/24; H01B 12/00
[52] U.S. Cl. ............................... 148/11.5 Q; 29/599; 148/133
[58] Field of Search .............. 148/11.5 Q, 11.5 F, 148/127, 133; 29/599; 174/128 S

[56] References Cited

U.S. PATENT DOCUMENTS 4,195,199  3/1980  Hillmann et al. ................ 29/599

FOREIGN PATENT DOCUMENTS 52-127195  10/1977  Japan ........................ 148/11.5 Q
1028183    5/1966   United Kingdom .
1342726    1/1974   United Kingdom .

OTHER PUBLICATIONS

Dew-Hughes et al., "Critical Current Densities of Bronze-Processed Nb₃(Sn$_{1-x}$Ga$_x$) Wires up to 23.5 T", J. Applied Physics, vol. 49, Jan. 1978, pp. 357-360.

*Primary Examiner*—Peter K. Skiff
*Attorney, Agent, or Firm*—Fitzpatrick, Cella, Harper & Scinto

[57] ABSTRACT

In a method for producing an Nb₃Sn superconductor which comprises elongating a composite composed of a core portion of an alloy containing niobium and a matrix portion of a copper-tin alloy, a copper-tin-aluminum alloy or a copper-tin-gallium alloy and heat-treating the elongated composite to form an Nb₃Sn layer between the core portion and the matrix portion; the improvement wherein the core portion of the composite is made of a niobium-titanium alloy containing 0.1 to 10 atomic percent of titanium.

3 Claims, 1 Drawing Figure

METHOD FOR PRODUCING NB3SN SUPERCONDUCTORS

This invention relates to a method for producing an $Nb_3Sn$ superconductor of improved properties for use in generating a strong magnetic field.

Superconducting wires are used as coils for electromagnets used in generating strong magnetic fields because they permit flowing of a large current without power consumption and this property can be retained even in strong magnetic fields. Nb-Ti alloy wires are now used in by far the greatest amount, but they can generate a magnetic field of about 85,000 gausses (8.5 Tesla; 8.5 T for short) at the highest. In order to generate a higher magnetic field, it is necessary to use compound superconductors having a high upper critical magnetic field ($Hc_2$). However, the compound superconductors lack plasticity, and this constitutes a great drawback against commercialization of compound superconductors.

In recent years, methods utilizing diffusion, such as a surface diffusion method and a composite fabricating method, have successively been developed to enable an $Nb_3Sn$ compound or a $V_3Ga$ compound to be drawn into wires, and have gained commercial acceptance. The surface diffusion method comprises continuously passing an Nb tape, for example, through a molten tin (Sn) bath to deposit Sn on the surface of the tape, and then heat-treating the tape at a suitable temperature to induce a diffusion reaction between Nb and Sn and to form an $Nb_3Sn$ layer compound layer on the surface of the tape. The composite fabricating method, on the other hand, comprises making a composite structure composed of a portion of Nb and a portion of a solid solution of Cu-Sn, fabricating (e.g., drawing) the composite structure, and then heat-treating the fabricated composite structure to react only Sn in the Cu-Sn alloy selectively with Nb and thereby to form an $Nb_3Sn$ compound layer at the interface between the two portions. This method is a kind of solid diffusion technique. Because both Nb and the Cu-Sn alloy have sufficient plasticity, the composite can be easily fabricated into a desired form such as a wire, tape or tube before heat-treating it. Ultrafine multicore-type wires having stability against rapid changes in magnetic field can be produced by embedding a multiplicity of Nb rods in a matrix of Cu-Sn alloy and fabricating the resulting structure into a fine wire by drawing, etc. $Nb_3Sn$ or $V_3Ga$ compound wires made by such a surface diffusion method and a composite fabricating method are now used in small-sized strong field magnets for investigation of the properties of materials, etc.

On the other hand, investigations have been under way recently for development of large-sized strong field magnets for use in nuclear fusion reactors, high energy storage devices, superconducting power generators, etc. For use in these large-sized strong field magnets, it is very much desired to develop ultrafine multicore compound superconducting wires which have a high critical current Ic in a strong magnetic field region of at least 15 T and can maintain a stable superconducting state against rapid changes in magnetic field. However, the critical current Ic of an $Nb_3Sn$ compound wire made from a conventional composite of pure Nb and a Cu-Sn binary alloy rapidly decreases in a magnetic field of at least 10 T, and it is difficult to produce a superconducting magnet capable of generating a magnetic field of at least 12 T from this wire. On the other hand, a $V_3Ga$ compound wire has better strong field characteristics than the $Nb_3Sn$ compound wire, but since the cost of the material is much higher than that of $Nb_3Sn$, it is advantageous to use an $Nb_3Sn$ wire whose strong magnetic field characteristics have been improved by addition of small amounts of alloy elements when building large-sized facilities using large amounts of wires. A method was recently developed which comprises making a composite from a binary alloy made by dissolving hafnium (Hf) in Nb and a Cu-Sn binary alloy or a Cu-base ternary alloy made by adding Ga or Al to the Cu-Sn binary alloy, fabricating the composite by drawing, etc., and heat-treating the fabricated composite to provide an $Nb_3Sn$ compound wire having markedly improved superconducting properties in a strong magnetic field (see U.S. Pat. No. 4,224,087). Hf in the Nb alloy dissolves in the $Nb_3Sn$ layer to increase greatly the diffusion rate and formation rate of the $Nb_3Sn$ layer, the thickness of the $Nb_3Sn$ layer and Ic of the product. Ga or Al added to the Cu-Sn alloy diffuses in the Nb alloy together with Sn and dissolves in the resulting $Nb_3Sn$ layer to increase its $Hc_2$. The strong magnetic field properties of an $Nb_3Sn$ superconducting wire containing Hf, or both Hf and Ga, or both Hf and Al produced in the above-mentioned manner are markedly improved, and a high Ic value is obtained in a strong magnetic field as well. Since, however, Hf used in the invention of U.S. Pat. No. 4,224,087 is expensive, it adds to the cost of the $Nb_3Sn$ wire which is cheaper than $V_3Ga$ wires.

It is an object of this invention therefore to provide an $Nb_3Sn$ superconductor for strong magnetic fields whose strong magnetic field characteristics are improved by the addition of inexpensive additive elements and which can compete with $V_3Ga$.

The above object of the invention is achieved, in a method for producing an $Nb_3Sn$ superconductor which comprises elongating a composite composed of a core portion of an alloy containing niobium and a matrix portion of a copper-tin alloy, a copper-tin-aluminum alloy or a copper-tin-gallium alloy and heat-treating the elongated composite to form an $Nb_3Sn$ layer between the core portion and the matrix portion, by the improvement wherein the core portion of the composite is made of a niobium-titanium alloy containing 0.1 to 10 atomic percent of titanium.

In the present application, the contents of component elements in alloys are all expressed in atomic percent.

The improvement provided by this invention is that in the method of U.S. Pat. No. 4,224,087, that is, the method which comprises fabricating (e.g., elongating) a composite composed of a core of an Nb-Hf alloy and a matrix portion of Cu-Sn, Cu-Sn-Al or Cu-Sn-Ga and heat-treating the elongated composite to form an $Nb_3Sn$ superconductor, an Nb-Ti alloy is used as the core. By using Ti which is much less in cost than Hf, the intended $Nb_3Sn$ superconductor having superior strong magnetic field characteristics can be obtained.

According to the method of this invention, an Nb-base alloy having Ti dissolved therein, and separately, a Cu-Sn alloy or an alloy of Cu-Sn further containing Ga or Al are produced by melting techniques. Then, a composite in various shapes composed of the Nb-base alloy surrounded by the Cu-base alloy is made, and fabricated into a wire, tape, tube, etc. by drawing, rolling, tube-drawing, etc.

Ti contained in the Nb-base alloy constituting the core has the action of promoting formation of $Nb_3Sn$ by the diffusion and reaction of Sn into and with the Nb-base alloy. As a result of dissolving of Ti in $Nb_3Sn$, the upper critical magnetic field $Hc_2$ is increased and with it, the critical current density Jc in a strong magnetic filed of at least 12 T becomes higher. In order to ensure these actions and thereby to obtain an $Nb_3Sn$ superconductor having a high critical current Ic in a strong magnetic fields as well, the amount of Ti is preferably 0.1 to 10%, especially 1 to 5%.

On the other hand, the amount of Sn in the Cu-base alloy constituting the matrix portion of the composite is preferably at least 2%, especially at least 5%, in order to obtain a sufficient $Nb_3Sn$ layer thickness, and not more than 9%, especially not more than 7.5%, in order to ensure good fabricability.

Preferably, Ga or Al is added to the Cu-Sn alloy of the matrix because such an additive element serves to increase the $Hc_2$ of $Nb_3Sn$ further. The suitable amount of Ga or Al to be added to the Cu-Sn alloy is at least 0.1%, preferably at least 2%, in order to obtain good superconducting characteristics, and not more than 15%, preferably not more than 10%, (for Ga), and not more than 18%, preferably not more than 12%, (for Al) in order to ensure the good fabricability of the Cu-base alloy.

The composite fabricated as above is then heat-treated to diffuse Sn or both Sn and a small amount of Ga or Al in the Nb-base alloy and to form an $Nb_3Sn$ layer containing a small amount of Ti or Ga or Al and having excellent superconducting characteristics at the interface of the composite. Heat-treatment for the diffusion is carried out at a temperature of 600° to 900° C., preferably 700° to 800° C., for a period of 1 minute to 200 hours, preferably 10 to 100 hours. Under lower temperature and shorter period conditions, the heat-treatment cannot form a sufficient amount of the $Nb_3Sn$ layer. If the temperature is higher and the period is longer than the specified limits, crystal grains of $Nb_3Sn$ become coarse and the superconducting characteristics of the resulting product become inferior.

The $Nb_3Sn$ composite wire of the invention containing Ti or both Ti and Ga or Ti and Al has a higher critical current Ic and higher upper critical magnetic field $Hc_2$ than conventional $Nb_3Sn$ wires, and as a result, Ic in a strong magnetic field is markedly improved. Accordingly, the present invention enables various devices utilizing superconductors to be used with sufficient latitude and increases the performance, safety and reliability of the devices. In addition, Ti added to Nb in order to improve the strong magnetic field characteristics is much cheaper than Hf added for the same purpose, and can markedly improve the strong magnetic field characteristics of $Nb_3Sn$ without scarcely increasing the cost of production. The economic and technical effects of the invention, are therefore great. Furthermore, because the composite fabricating technique is used in the method of this invention, it is possible to produce ultrafine multicore-type wires which can maintain its superconducting properties stable against rapid variations in magnetic field and which shows small ac losses. Wires of large current-carrying capacity can also be easily produced, and devices in which these wires are used can be increased in size.

Since the $Nb_3Sn$ composite wires improved in accordance with this invention can generate a strong magnetic field of at least 15 T with good stability, they can be effectively used as coils of various strong field magnets in nuclear fusion reactors, high energy storage devices, superconducting power generators, high energy physical accelerators, devices for investigating the material properties, etc.

The following Examples further illustrate the present invention.

The accompanying drawing shows magnetic field-critical current curves of the $Nb_3Sn$ superconductors obtained in Examples 1 and 2. The curves 1, 2, 3, 4 and 5 refer to superconductors from Nb/Cu-7% Sn. Nb-2% Ti/Cu-7% Sn, Nb-5% Ti/Cu-7% Sn, Nb-2% Ti/Cu-5% Sn-4% Ga, and Nb-5% Ti/Cu-5% Sn-4% Ga, respectively.

EXAMPLE 1

A material composed of pure Nb (sample G, control), a material composed of pure Nb and 2% of Ti (sample A), and a material composed of pure Nb and 5% of Ti (sample B) were each melted in an arc melting furnace in an atmosphere of argon, and fabricated to a diameter of 3 mm by grooved rolls and by swaging to form a pure Nb rod and Nb-Ti alloy rods. Each of these rods was inserted into a tube of Cu-7% Sn alloy having an outside diameter of 8 mm and an inside diameter of 3 mm, and fabricated into a tape having a thickness of about 250 $\mu$m and a width of about 5 mm by grooved rolls and flat rolls, and heat-treated in an argon atmosphere at 800° C. for 100 hours. The thicknesses and Tc values of the $Nb_3Sn$ layers of the samples were measured, and the results are shown in Table 1 below.

The Ic values of these samples were measured and are shown in the accompanying drawing. It is seen that the addition of Ti markedly increases the thickness of the $Nb_3Sn$ layer, and markedly improves the Ic characteristics in all magnetic field regions, particularly in a strong magnetic field region. The marked increase of Ic in the strong magnetic field region is due presumably to the rise of $Hc_2$ which Ic caused by the dissolving of Ti in the $Nb_3Sn$ phase.

EXAMPLE 2

In the same way as in Example 1, a rod of Nb-2% Ti (sample C) and a rod of a 5% Ti (sample D) alloy were each inserted into a tube of a Cu-5% Sn-4% Ga alloy, and the composites were each fabricated into a tape form and heat-treated at 800° C. for 100 hours. The thickness and Tc values of the $Nb_3Sn$ layers of the resulting samples are shown in Table 1, and the Ic values of these samples are shown in the accompanying drawing.

It is seen that by adding Ti and Ga simultaneously, Tc increases, and the decrease of Ic by the increase of the magnetic field is apparently reduced to give a high Ic in a strong magnetic field. This is due presumably to a further increase in $Hc_2$ incident to the increase of Tc. It is expected therefore that in a magnetic field of more than 17 T, Ic will be higher than the wires obtained in Example 1.

EXAMPLE 3

In the same way as in Example 2, composite tapes composed of an Nb-2% Ti (sample E) alloy or an Nb-5% Ti (sample F) alloy and a Cu-5% Sn-4% Al alloy were produced, and then heat-treated at 800° C. for 100 hours. Table 1 shows the thicknesses and Tc values of the $Nb_3Sn$ layers of the resulting samples. It is seen that by the simultaneous addition of Ti and Al, Tc increases, and as in Example 2, a high Ic value is obtained in strong magnetic field.

TABLE 1

| Example | Sample | Core (atomic percent) | Matrix (atomic percent) | Thickness of the $Nb_3Sn$ layer ($\mu m$) | Tc (K) |
|---|---|---|---|---|---|
| 1 | A | Nb—2%Ti | Cu—7%Sn | 30 | 17.5 |
|   | B | Nb—5%Ti | Cu—7%Sn | 35 | 17.4 |
| 2 | C | Nb—2%Ti | Cu—5%Sn—4%Ga | 20 | 17.7 |
|   | D | Nb—5%Ti | Cu—5%Sn—4%Ga | 25 | 17.6 |
| 3 | E | Nb—2%Ti | Cu—5%Sn—4%Al | 20 | 17.7 |
|   | F | Nb—5%Ti | Cu—5%Sn—4%Al | 23 | 17.6 |
| Control | G | Nb | Cu—7%Sn | 15 | 17.2 |

What we claim is:

1. In a method for producing an $Nb_3Sn$ superconductor which comprises elongating a composite comprising a core portion of an alloy containing niobium and a matrix portion selected from the group consisting of a copper-tin alloy containing 2 to 9 atomic percent tin, a copper-tin-aluminum alloy containing 2 to 9 atomic percent tin and 0.1 to 18 atomic percent aluminum and a copper-tin-gallium alloy containing 2 to 9 atomic percent tin and 0.1 to 15 atomic percent gallium; and heat-treating the elongated composite to form an $Nb_3Sn$ layer between the core portion and the matrix portion; the improvement wherein the core portion of the composite is made of a niobium-titanium alloy containing 0.1 to 10 atomic percent of titanium.

2. The method of claim 1 wherein the heat-treating temperature is 600° to 900° C.

3. The process of claim 1 wherein the heat-treatment is carried out for a period of 1 minute to 200 hours.

* * * * *